(12) United States Patent
Schuda et al.

(10) Patent No.: US 12,074,044 B2
(45) Date of Patent: Aug. 27, 2024

(54) WAFER-LIKE SENSOR

(71) Applicant: CyberOptics Corporation, Golden Valley, MN (US)

(72) Inventors: Felix J. Schuda, Saratoga, MN (US); Mark C. LeClair, Lake Elmo, MN (US)

(73) Assignee: CyberOptics Corporation, Golden Valley, MN (US)

( * ) Notice: Subject to any disclaimer, the term of this patent is extended or adjusted under 35 U.S.C. 154(b) by 699 days.

(21) Appl. No.: 16/678,278

(22) Filed: Nov. 8, 2019

(65) Prior Publication Data

US 2020/0152494 A1    May 14, 2020

Related U.S. Application Data

(60) Provisional application No. 62/767,251, filed on Nov. 14, 2018.

(51) Int. Cl.
| | | |
|---|---|---|
| *B32B 17/10* | (2006.01) | |
| *G05B 19/418* | (2006.01) | |
| *H01L 21/66* | (2006.01) | |
| *H01L 21/67* | (2006.01) | |

(52) U.S. Cl.
CPC .. *H01L 21/67276* (2013.01); *B32B 17/10036* (2013.01); *B32B 17/10137* (2013.01); *B32B 17/1044* (2013.01); *B32B 17/1055* (2013.01); *B32B 17/10651* (2013.01); *B32B 17/10733* (2013.01); *B32B 17/10899* (2013.01); *B32B 17/10981* (2013.01); *G05B 19/41875* (2013.01); *H01L 22/34* (2013.01); *G05B 2219/32179* (2013.01)

(58) Field of Classification Search
CPC ............... B32B 3/26; B32B 17/10036; B32B 17/10137; B32B 17/1055; B32B 17/10651; H01L 22/34; G05B 2219/32179
See application file for complete search history.

(56) References Cited

U.S. PATENT DOCUMENTS

| | | | |
|---|---|---|---|
| 7,029,930 B2 | 4/2006 | Tomer et al. | |
| 9,159,587 B2 | 10/2015 | Canale et al. | |
| 9,719,867 B2 * | 8/2017 | Sharratt | G01K 19/00 |
| 10,460,966 B2 | 10/2019 | Sun et al. | |
| 2007/0046284 A1 | 3/2007 | Wayne et al. | |

(Continued)

FOREIGN PATENT DOCUMENTS

| | | |
|---|---|---|
| CN | 104220392 | 12/2014 |
| CN | 105358949 B | 2/2016 |

(Continued)

OTHER PUBLICATIONS

International Search Report and Written Opinion for International Patent Application No. PCT/US2019/060905, date of mailing: Mar. 9, 2020, date of filing: Nov. 12, 2019, 13 pages.

(Continued)

*Primary Examiner* — Joanna Pleszczynska
(74) *Attorney, Agent, or Firm* — Christopher R. Christenson; Kelly, Holt & Christenson, P.L.L.C.

(57) ABSTRACT

A wafer-like semiconductor sensor includes a wafer-like base formed of a plurality of layers of chemically-hardened glass and an electronics module mounted to a recessed pocket in the base and containing a sensor.

26 Claims, 4 Drawing Sheets

(56) References Cited

U.S. PATENT DOCUMENTS

| | | |
|---|---|---|
| 2010/0155098 A1 | 6/2010 | Sun et al. |
| 2012/0229419 A1* | 9/2012 | Schwartz ............... G06F 3/0418 345/174 |
| 2013/0186141 A1* | 7/2013 | Henry .................... C03C 21/00 65/30.14 |
| 2015/0132570 A1 | 5/2015 | Lin et al. |
| 2016/0082705 A1* | 3/2016 | Fisher .................... B32B 37/06 156/99 |
| 2017/0015584 A1 | 1/2017 | Krzyzak et al. |
| 2017/0365495 A1 | 12/2017 | Sun et al. |
| 2018/0184532 A1* | 6/2018 | Kim .................... H05K 5/0226 |
| 2018/0194669 A1 | 7/2018 | Ding et al. |

FOREIGN PATENT DOCUMENTS

| | | |
|---|---|---|
| CN | 105408109 A | 3/2016 |
| JP | H0945751 A | 2/1997 |
| JP | 2007-528615 A | 10/2007 |
| WO | 2005088681 A1 | 9/2005 |

OTHER PUBLICATIONS

Office Action for Taiwanese Patent Application No. 108141023, dated Feb. 1, 2021, 18 pages including English translation.

Korean Office Action for Application No. 10-2021-7014798, Dated Dec. 29, 2022, 5 pages including English Translation.

First Office Action for Japanese Patent Application No. 2021-526319, dated Jun. 28, 2022, 5 pages including English translation,.

Search Report for European Patent Application No. 19885116.4, dated Jun. 23, 2022, 9 pages.

Written Opinion for Singaporean Patent Application No. 11202104665X, dated Aug. 23, 2022, 8 pages.

First Office Action For Chinese Patent Application No. 201980074949.7, Dated Sep. 28, 2023, 19 pages including English Translation.

Office Action for Israeli Patent Application No. 283062, Dated Aug. 16, 2023, 4 pages.

Office Action for European Patent Application No. 19885116.4, dated Apr. 18. 2024, 5 pages.

\* cited by examiner

WAFER-LIKE SENSOR

CROSS-REFERENCE TO RELATED APPLICATION

The present application is based on and claims the benefit of U.S. provisional patent application Ser. No. 62/767,251, filed Nov. 14, 2018, the content of which is hereby incorporated by reference in its entirety.

BACKGROUND

Semiconductor processing systems are characterized by extremely clean environments and extremely precise semiconductor wafer movement. Industries place extensive reliance upon high-precision robotic systems to move substrates, such as semiconductor wafers, about the various processing stations within a semiconductor processing system with requisite precision.

In the past, attempts have been made to provide wafer-like sensors in the form of a wafer, which can be moved through the semiconductor processing system to wirelessly convey information within the semiconductor system. As used herein, "wafer-like" is intended to mean a sensor in the form of a semiconductor wafer. Attempts have been made to provide wireless wafer-like sensors that include additional types of detectors to allow the wafer-like sensor to measure a host of internal conditions within the processing environment of the semiconductor processing system.

Wireless wafer-like sensors enable measurements to be made at various points throughout the processing environment with reduced disruption of the internal environment as well as reduced disturbance of the wafer handling mechanisms and fabrication processes (e.g., baking, etching, physical vapor deposition, chemical vapor deposition, coating, rinsing, drying, etc.). For example, the wireless wafer-like sensor does not require that a vacuum chamber be vented or pumped down; nor does it pose any higher contamination risk to an ultra-clean environment than is otherwise suffered during normal processing. The wireless wafer-like sensor form factor enables measurements of process conditions with minimal observational uncertainty.

Examples of wireless substrate-like sensors include those sold under the trade designations, ReticleSense® Airborne Particle Sensor, ReticleSense® Auto Multi Sensor™, WaferSense® Airborne Particle Sensor™, WaferSense® Auto Multi Sensor™, WaferSense® Auto Teaching System, WaferSense® Auto Vibration System, WaferSense® Auto Gapping System, WaferSense® Auto Leveling System 2 Vertical, all of which are available from CyberOptics Corporation of Golden Valley, Minn. Any or all of such wireless substrate-like sensors may incorporate various embodiments described herein.

The discussion above is merely provided for general background information and is not intended to be used as an aid in determining the scope of the claimed subject matter. The claimed subject matter is not limited to implementations that solve any or all disadvantages noted in the background.

SUMMARY

In one example, a wafer-like semiconductor sensor includes a wafer-like base formed of a plurality of layers of chemically-hardened glass and an electronics module mounted to a recessed pocket in the base and containing a sensor.

In another example, a wafer-like semiconductor sensor includes an annular layer formed of chemically-hardened glass and a lower layer formed of chemically-hardened glass, wherein the annular layer is chemically bonded to the lower layer. In another example, a wafer-like semiconductor sensor is formed with an upper annular wafer layer formed of chemically hardened glass laminated over a lower wafer layer formed chemically-hardened glass, and inner perimeter of the annular wafer layer defines a recessed pocket that seats an electronics module coupled to the lower layer.

This summary is provided to introduce a selection of concepts in a simplified form that are further described below in the Detailed Description. This summary is not intended to identify key features or essential features of the claimed subject matter, is not intended to describe each disclosed embodiment or every implementation of the claimed subject matter, and is not intended to be used as an aid in determining the scope of the claimed subject matter. Many other novel advantages, features, and relationships will become apparent as this description proceeds. The figures and the description that follow more particularly exemplify illustrative embodiments.

While the above-identified figures set forth one or more embodiments of the disclosed subject matter, other embodiments are also contemplated, as noted in the disclosure. In all cases, this disclosure presents the disclosed subject matter by way of representation and not limitation. It should be understood that numerous other modifications and embodiments can be devised by those skilled in the art which fall within the scope and spirit of the principles of this disclosure.

DETAILED DESCRIPTION

When constructing substrate-like sensors that must travel through a semiconductor processing system, the substrate that the sensor is mounted on is critical. The wafer-like substrate must be flat to allow for effective vacuum chucking such that the wafer-like sensor can be held sufficiently in place during various testing operations. The wafer-like substrate must not contaminate the semiconductor processing system (e.g. fabrication tools). The wafer-like substrate must be smooth and dimensionally stable. The wafer-like substrate material must not interfere with radio frequency (rf) communications between the wireless wafer-like sensor and the control system or other remote device.

Very few materials can satisfy these requirements. Silicon satisfies most of these requirements, but it fractures too easily. Carbon fiber composite is very stable and strong and does not fracture, however, it often is not smooth enough and flat enough to allow for reliable vacuum chucking. Additionally, carbon fiber composites may interfere with radio frequency communication. A wafer-like sensor comprising material that prevents the problems listed above is needed. Such a wafer-like sensor is described herein.

Embodiments described herein generally employ chemically-hardened glass (CHG) in constructing wafer-like substrate for wireless wafer-like sensors. CHG is available that can be made in thicknesses that allow for simulation of silicon wafers. In one example, the wafer-like substrate is formed as a sandwich consisting of a bottom disk of CHG and an annular top piece. The sandwich embodiment has a number of advantages: 1) it contains painted CHG surfaces between the two CHG layers and thus prevents the painted surfaces from contacting components of the semiconductor process (e.g. fabrication tools); 2) it allows for the inclusion in the sandwich of an anti-shatter film to prevent shards of CHG from coming loose in the event of breakage; and 3) it allows for a strong 0.8 mm thick outer area and a thinner 0.4 mm thick inner area, thus allowing the construction of an overall thinner wafer-like sensor. CHG is available under various trade names, such as Gorilla glass, Dragontail and Xensation.

Figure 1:
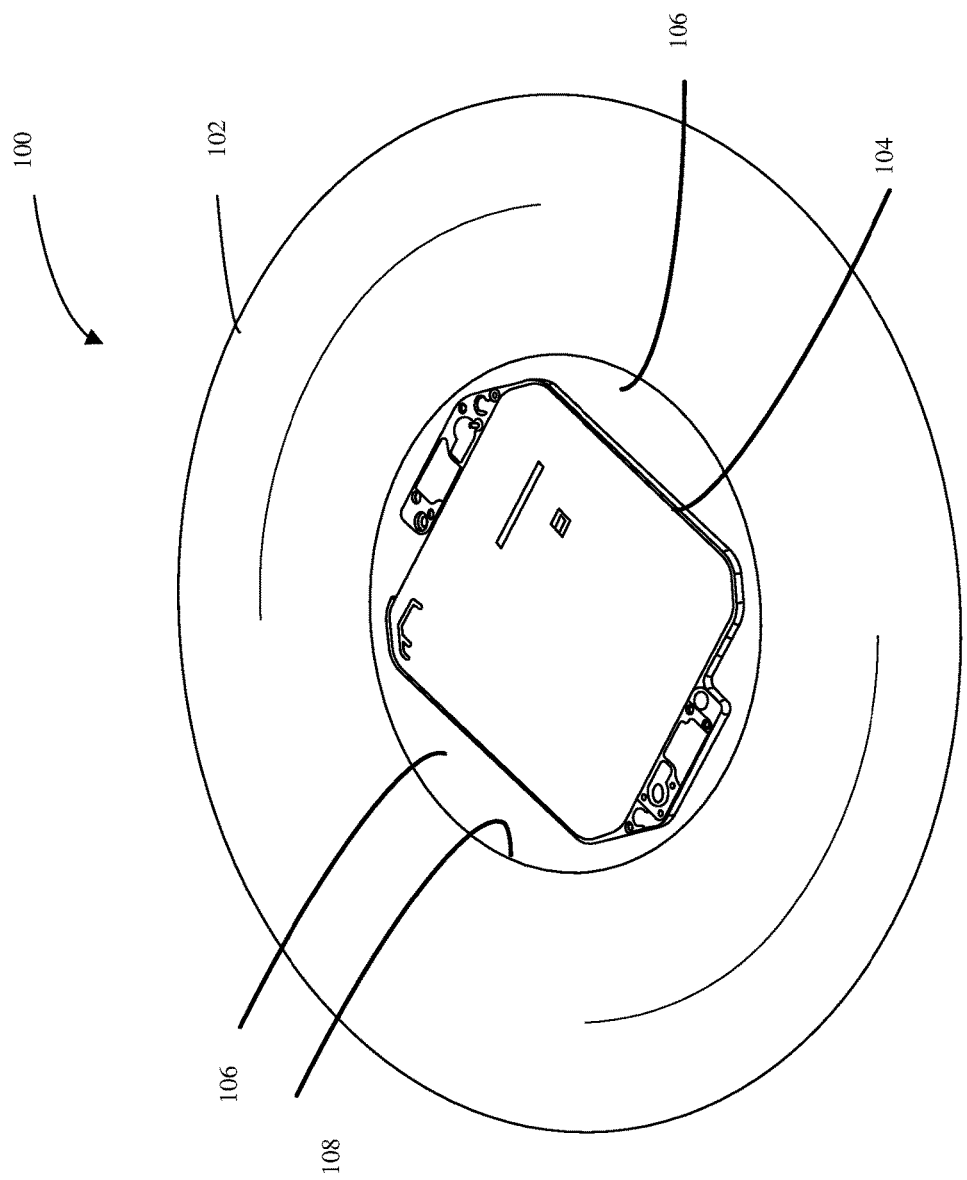
FIG. 1 is a diagrammatic perspective view of a wireless wafer-like sensor.

FIG. 1 is a diagrammatic perspective view showing one example of a wireless wafer-like sensor. Wireless wafer-like sensor 100 includes wafer-like substrate 102 that is sized and shaped as a semiconductor wafer. In one example, wafer-like substrate 102 has a diameter falling between the range of 150-300 mm.

Sensor 100 further includes electronics housing 104 disposed in a central region of sensor 100. For the purposes of this application, the term 'housing' can be used interchangeably with the term 'module'. The electronics within housing 104 may be any suitable electronics currently available or later developed that provide features relevant to sensing any suitable parameter within a semiconductor process and wirelessly conveying information about the sensed parameter, such as, but not limited to, sensors, measurement circuitry, communication circuitry, power sources, et cetera. Examples of such sensors are the Wafersense® line of sensors, offered by CyberOptics Corporation of Golden Valley, Minn. Parameters can be, for example, positional information (e.g. horizontal, vertical, and tilt position [i.e. location along the x, y and z axes]), humidity, the presence of particles, speed, acceleration, vibration, leveling, et cetera.

Figure 2:
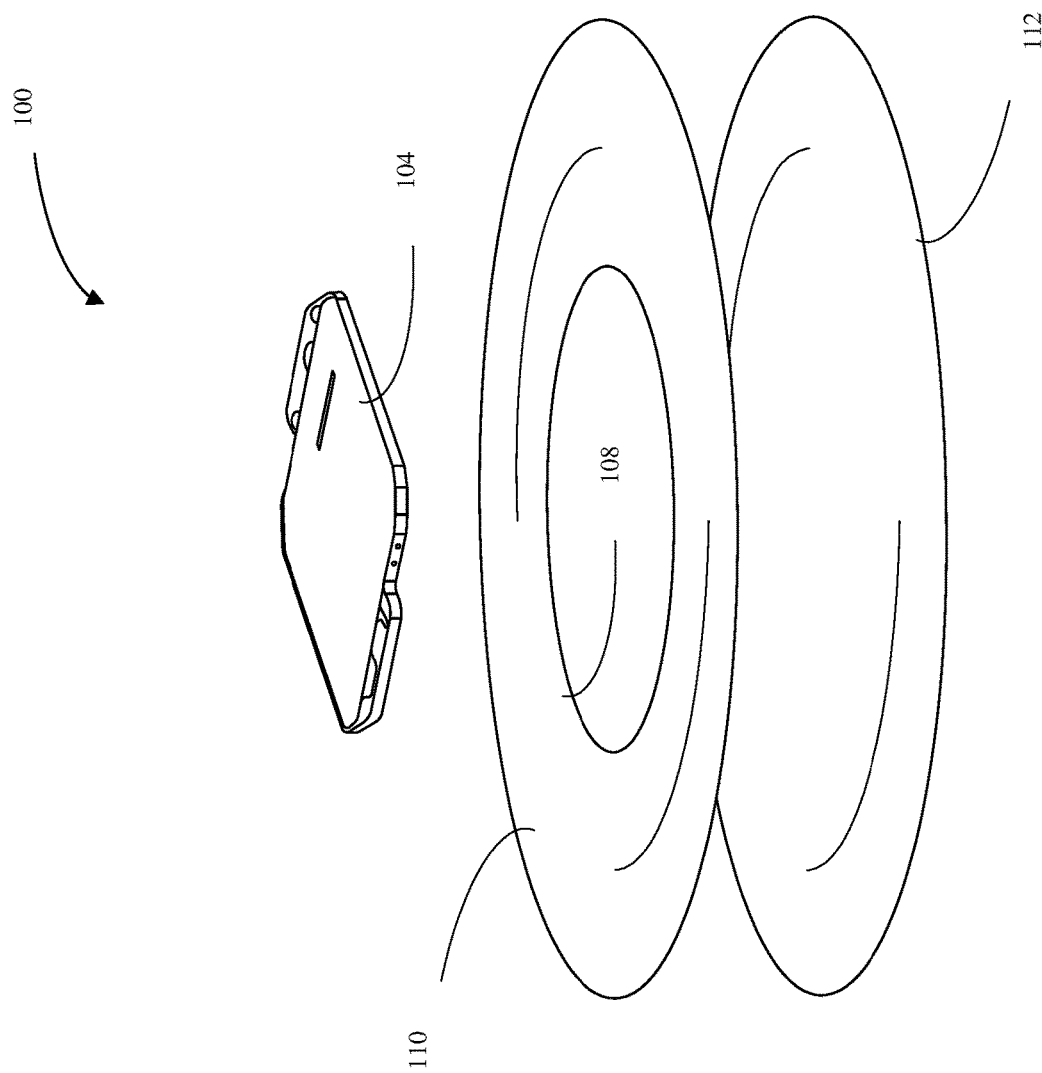
FIG. 2 is an exploded view of a wireless wafer-like sensor.

FIG. 2 is an exploded view showing one example of a wireless wafer-like sensor. Wafer-like sensor 100 includes electronics housing 104, inside diameter 108, annular layer 110, and bottom layer 112. In one example, sensor 100 is formed by bonding layers 110 and 112. This bonding can be done by laminating layers 110 and 112 together with a suitable epoxy. However, any other suitable techniques can also be used to bond layers 110 and 112 together. In one example, an anti-shatter film is also bonded between layers 110 and 112 to ensure that, should the chemically-hardened glass wafer-like substrate of sensor 100 fracture, the shards will not dislodge in the semiconductor process or components (e.g. the fabrication tool). In another example, the epoxy is opaque. In one example the epoxy is transparent (along with the CHG). In other example, the epoxy is not opaque and one or both inner surfaces (the surface of 112 facing 110 and the surface of 110 facing 112) can be painted or otherwise coated with an opaque layer to ensure that light does not pass through the wafer-like substrate. For example the inner layers could be painted black so that sensor 100 not only prevents light from shining through, but also prevents those painted layers from being exposed to damage in the semiconductor process, such that, for example, the painted layer would be scratched or chipped and thus allow light therethrough.

Annular layer 110 has a hole therethrough, defined by inner perimeter 108. This hole creates a region for electronics housing 104 to seat and be bonded to lower layer 112. Additionally, by sandwiching annular layer 110 and lower layer 112, sensor 100 can be a generally thinner design, reducing cost and material. In one example, sensor 100 has a thickness of 0.8 mm at its outer portion, that is, the portion comprising both annular layer 110 and lower layer 112; and a thickness of 0.4 mm at its inner portion, that is, the portion defined by inner perimeter 108 when layers 110 and 112 are bonded. In this embodiment, each of layers 110, 112 may have a thickness of 0.4 mm. In another example, annular layer 110 has a 0.5 mm thickness and lower layer 112 has a thickness of 0.3 mm. In one example both annular layer 110 and lower layer 112 comprise a SEMI notch on each of their respective outside perimeters such that precise alignment of sensor 100 is possible during manufacturing.

Figure 3:
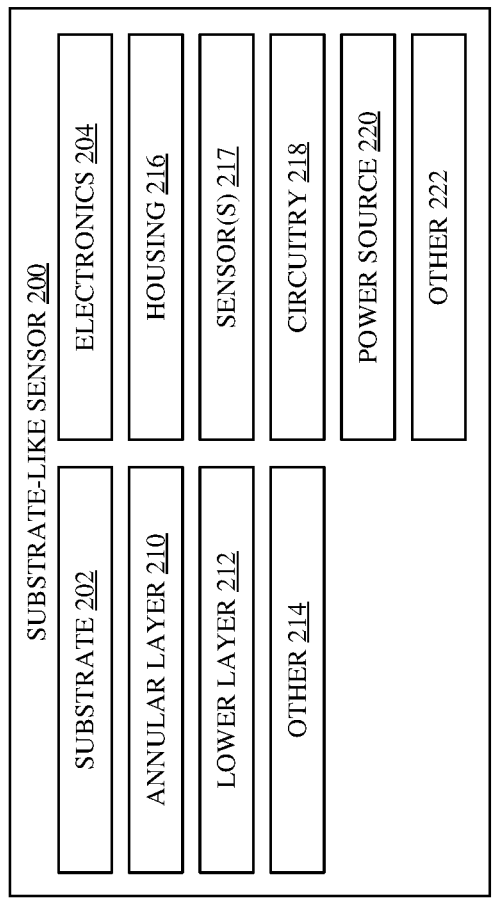
FIG. 3 is a simplified block diagram showing one example of a wafer-like sensor.

FIG. 3 is a simplified block diagram showing one example of a wireless wafer-like sensor. Sensor 200 includes wafer-like substrate 202 and electronics 204. Wafer-like substrate 202 includes annular layer 210, lower layer 212, and other 214. Wafer-like substrate 202 can be similar to wafer-like substrate 102. Layers 210 and 212 can be similar to layers 110 and 112. Wafer-like substrate 202 can include painted inner surfaces of layers 210 and 212. Wafer-like substrate 202 can be transparent. An anti-shatter film can be placed between layers 210 and 212. Annular layer 210 can comprise an inner perimeter that forms a region into which electronics 204 seat and are bonded onto lower layer 212. Wafer-like substrate 202 can have a thickness of 0.8 mm at its outer portion and a thickness of 0.4 mm at its inner portion. Wafer-like substrate 202 can be made of CHG. In one example, wafer-like substrate 202 can be a sandwiched design, wherein annular layer 210 and lower layer 212 are bonded and/or laminated together by use of, for example, an epoxy. Other designs 214 can also include a single, or multiple layers and/or disks of CHG bonded to other layers and/or disks comprising different materials, for example, but not limited to, carbon fiber composite, silicon, quartz, other glasses, and any other suitable materials.

Electronics 204 includes housing 216, sensor(s) 217, circuitry 218, power source 220 and other 222. Housing 216 provides a protective cover for the internal elements of electronics 204 and can be formed of any suitable materials, including, but not limited to, aluminum, carbon fiber composite, or CHG. In one example, housing 216 comprises CHG and is painted opaque, such that light does not pass therethrough. In another example, housing 216 comprises CHG and is transparent. Sensor(s) 217 are configured to sense positional information and/or semiconductor process parameters. Such parameters can include, for example, positional information (e.g. horizontal, vertical, and tilt position [i.e. location along the x, y and z axes]), along with other relevant data, such as humidity, the presence of particles, speed, acceleration, vibration, leveling, etc. Sensor(s) can be any number of sensors suitable for a semiconductor process, including ReticleSense® Airborne Particle Sensor, ReticleSense® Auto Multi Sensor™, WaferSense® Airborne Particle Sensor™, WaferSense® Auto Multi Sensor™, WaferSense® Auto Teaching System, WaferSense® Auto Vibration System, WaferSense® Auto Gapping System, WaferSense® Auto Leveling System 2 Vertical, all of which are available from CyberOptics Corporation of Golden Valley, Minn., along with any of the other sensors mentioned herein.

Circuitry 218 can include any electrical circuitry suitable for wireless wafer-like sensors. Circuitry 218 can include communication circuitry configured to communicate (e.g. via a wireless or Bluetooth protocol) sensed positional data and/or environmental parameters to a control room or other remote device, for example, providing an indication to a user interface. Circuitry 218 can include measurement circuitry configured to receive raw sensor data and generate an output indicative of a measured parameter (e.g. location on the x, y or z axes). Circuitry 218 can include a circuit board (e.g. a printed circuit board). Power source 220 is configured to power components of electronics 204 and can include rechargeable and nonrechargeable batteries. Other 222 can include any other suitable electronic components. For example, other 222 can include an extended range antenna configured to provide communication capabilities from further distances.

Figure 4:
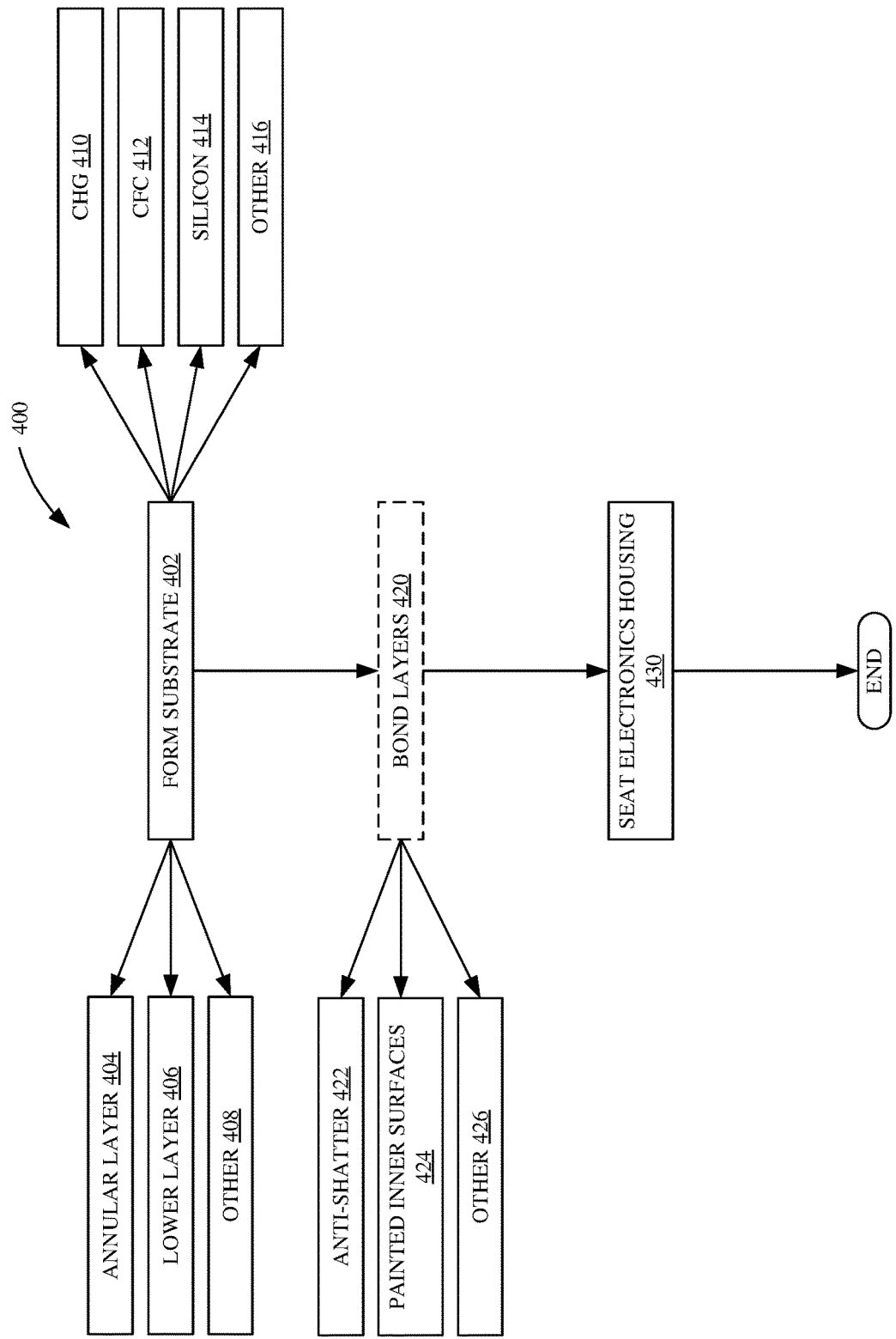
FIG. 4 is a flowchart showing one example of a method of manufacturing a wafer-like sensor.

FIG. 4 is a flowchart showing one example method of manufacturing a wireless wafer-like sensor. Method 400 starts at block 402 where a wafer-like substrate is formed. The wafer-like substrate can comprise an annular upper layer 404 and a lower layer 406 (e.g. layers 110/210 and 112/212). The wafer-like substrate can comprise other designs 408, such as multiple layers of varying materials. The wafer-like substrate can be formed of CHG 410, carbon fiber composite 412, silicon 414, or other materials 416, such as, but not limited to, quartz or other types of glasses. In one example, the wafer-like substrate consists of a CHG annular layer and a CHG lower layer. In another example, the wafer-like substrate comprises multiple layers of varying materials, for example, a layer of CHG and one or multiple layers of other materials, such as, but not limited to, carbon fiber composite, silicon, quartz, other glasses, etc. In one example, the outer perimeter of the wafer-like substrate comprises a SEMI notch.

Method 400 proceeds at block 420 where the layers are bonded or otherwise coupled together. The layers can be bonded, for example, laminated, using, for example, an epoxy. An anti-shatter film 422 can be placed between the layers, for example an annular layer and a lower layer. The interior surfaces of the layers can be painted 424, such that no light passes through (e.g. opaque). Other designs 426 can be used, for example, the epoxy used to bond the layers at block 420 can be transparent or opaque, the layers can be transparent or opaque, and any other design suitable for a wireless wafer-like sensor.

Method 400 continues at block 430 where an electronics housing is seated on and bonded to the wafer-like substrate 430. In one example, the wafer-like substrate is formed of an annular upper layer and a lower layer, the annual upper layer having an inner diameter that defines a recessed pocket in which the electronics housing will sit. The electronics housing can, in one example, be chemically bonded to the substrate, for example, but not limited to, epoxy, or any other suitable chemical bonding method.

The components of method 400 can be similar to those described herein. For example, wafer-like substrate at block 402 can be wafer-like substrate 102, 202, or the wafer-like substrate formed by layers 110 and 112 and/or 210 and 212 (as described in FIGS. 2 and 3). Electronics housing at block 430 can be, for example, electronics housing 104 or 204.

It should be noted that while method 400 was described, for illustrative purposes and for the sake of explanatory clarity, in a certain order, those skilled in the art will understand that the steps of method 400 can be completed in varying orders and that no specific order was intended by this illustration.

Various features described above can be combined in a number of different combinations in accordance with embodiments of the present invention. In one example, multiple pieces of CHG can be laminated together, some of which may not be complete circular disks. In another example, disks of CHG could be bonded to other disks of different materials such as carbon fiber composite, silicon, quartz, etc. In another example, the center part of the housing could be constructed in an almost infinite number of variations. So, the CHG wafer could be bonded to a central electronics housing made of a large number of different materials and in different geometries.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A wafer-like semiconductor sensor assembly, comprising:
   a wafer-like base formed of a plurality of layers of chemically-hardened glass, the wafer-like base defining a recessed pocket therein; and
   an electronics module having a housing and a plurality of electrical components disposed within the housing, wherein the housing is at least partially disposed within the recessed pocket of the wafer-like base and contains a sensor, wherein the sensor is selected from the group consisting of a positional sensor, a particle sensor, a speed sensor, a humidity sensor, an acceleration sensor, a vibration sensor, and a leveling sensor.

2. The wafer-like semiconductor sensor assembly of claim 1, wherein the wafer-like base provides a surface suitable for vacuum chucking.

3. The wafer-like semiconductor sensor assembly of claim 1, and further comprising a layer of material disposed between the plurality of layers of chemically-hardened glass.

4. The wafer-like semiconductor sensor assembly of claim 3, wherein the layer of material includes an opaque coating.

5. The wafer-like semiconductor sensor assembly of claim 3, wherein the layer of material includes an anti-shatter film.

6. The wafer-like semiconductor sensor assembly of claim 1, wherein the housing is formed of chemically-hardened glass.

7. The wafer-like semiconductor sensor assembly of claim 6, wherein the housing is opaque.

8. The wafer-like semiconductor sensor assembly of claim 6, wherein the housing is transparent.

9. The wafer-like semiconductor sensor assembly of claim 1, wherein at least one layer of chemically-hardened glass of the plurality of layers of chemically-hardened glass has a thickness of 0.4 mm.

10. The wafer-like semiconductor sensor assembly of claim 1, wherein at least one layer of chemically-hardened glass of the plurality of layers of chemically-hardened glass includes a SEMI notch.

11. The wafer-like semiconductor sensor assembly of claim 1, wherein the recess has a depth of 0.4 mm.

12. The wafer-like semiconductor sensor assembly of claim 1, wherein the plurality of electrical components includes wireless communication circuitry.

13. The wafer-like semiconductor sensor assembly of claim 12, wherein the wireless communication circuitry is configured to communicate in accordance with the Bluetooth protocol.

14. The wafer-like semiconductor sensor assembly of claim 1, wherein the plurality of layers of chemically-hardened glass comprises at least a first layer of chemically-hardened glass and a second layer of chemically hardened glass, the first layer of chemically-hardened glass comprising a first side and a second side, the second layer of chemically hardened glass comprising a third side, a fourth side, and a hole, wherein the first side of the first layer of chemically-hardened glass faces the second layer of chemically- hardened glass, wherein the second side of the first layer of chemically-hardened glass faces away from the second layer of chemically-hardened glass, wherein the third side of the second layer of chemically-hardened glass faces the first layer of chemically-hardened glass, wherein the fourth side of the second layer of chemically-hardened glass faces away from the first layer of chemically-hardened glass, wherein at least one of the first side of the first layer of chemically-hardened glass and the third side of the second layer of chemically-hardened glass is painted.

15. The wafer-like semiconductor sensor assembly of claim 1, wherein the plurality of layers of chemically-hardened glass comprises at least a first bottom layer of chemically-hardened glass and a second layer of chemically-hardened glass, wherein the housing is mounted on the first bottom layer of chemically-hardened glass and is out of contact with the second layer of chemically-hardened glass.

16. The wafer-like semiconductor sensor assembly of claim 1, wherein the sensor is a positional sensor.

17. The wafer-like semiconductor sensor assembly of claim 16, wherein the positional sensor is configured to sense displacement in a horizontal direction.

18. The wafer-like semiconductor sensor assembly of claim 16, wherein the positional sensor is configured to sense displacement in a vertical direction.

19. The wafer-like semiconductor sensor assembly of claim 16, wherein the positional sensor is configured to sense tilt.

20. The wafer-like semiconductor sensor assembly of claim 1, wherein the sensor is a particle sensor.

21. The wafer-like semiconductor sensor assembly of claim 1, wherein the sensor is a speed sensor.

22. The wafer-like semiconductor sensor assembly of claim 1, wherein the sensor is a vibration sensor.

23. The wafer-like semiconductor sensor assembly of claim 1, wherein the sensor is a leveling sensor.

24. The wafer-like semiconductor sensor assembly of claim 1, wherein the sensor is configured to image a semiconductor processing environment.

25. The wafer-like semiconductor sensor assembly of claim 1, wherein the sensor is a humidity sensor.

26. The wafer-like semiconductor sensor assembly of claim 1, wherein the housing comprises a first end and a second end, coupled to the first end, the first end disposed between a plurality of sensors and the wafer-like base and the second end, opposite the first end, and configured to be disposed between the plurality of sensors and a processing environment.

* * * * *